(12) United States Patent
Wang et al.

(10) Patent No.: US 10,784,146 B2
(45) Date of Patent: Sep. 22, 2020

(54) METHOD OF DEPOSITING CHARGE TRAPPING POLYCRYSTALLINE SILICON FILMS ON SILICON SUBSTRATES WITH CONTROLLABLE FILM STRESS

(71) Applicant: GlobalWafers Co., Ltd, Hsinchu (TW)

(72) Inventors: Gang Wang, Grover, MO (US); Jeffrey L. Libbert, O'Fallon, MO (US); Shawn George Thomas, Chesterfield, MO (US); Igor Peidous, Eaton, OH (US)

(73) Assignee: GLOBALWAFERS CO., LTD., Hsinchu (TW)

( * ) Notice: Subject to any disclaimer, the term of this patent is extended or adjusted under 35 U.S.C. 154(b) by 0 days.

(21) Appl. No.: 16/720,136

(22) Filed: Dec. 19, 2019

(65) Prior Publication Data

US 2020/0126848 A1 Apr. 23, 2020

Related U.S. Application Data

(60) Division of application No. 16/186,683, filed on Nov. 12, 2018, which is a continuation of application No.
(Continued)

(51) Int. Cl.
*H01L 27/12* (2006.01)
*H01L 21/763* (2006.01)
(Continued)

(52) U.S. Cl.
CPC .... *H01L 21/76254* (2013.01); *H01L 21/0245* (2013.01); *H01L 21/02381* (2013.01);
(Continued)

(58) Field of Classification Search
CPC .................. H01L 21/28185; H01L 21/2026
See application file for complete search history.

(56) References Cited

U.S. PATENT DOCUMENTS

| 4,501,060 A | 2/1985 | Frye et al. |
| 4,755,865 A | 7/1988 | Wilson et al. |
(Continued)

FOREIGN PATENT DOCUMENTS

| EP | 0939430 A2 | 1/1999 |
| EP | 1865551 A2 | 12/2007 |
(Continued)

OTHER PUBLICATIONS

Gamble, H.S. et al., Low-loss CPW Lines on Surface Stabilized High-Resistivity Silicon, IEEE Microwave and Guided Wave Letters, Oct. 1999, pp. 395-397, vol. 9, No. 10.
(Continued)

*Primary Examiner* — Alia Sabur
(74) *Attorney, Agent, or Firm* — Armstrong Teasdale LLP

(57) ABSTRACT

A semiconductor on insulator multilayer structure is provided. The multilayer comprises a high resistivity single crystal semiconductor handle substrate, a textured oxide, nitride, or oxynitride layer, a polycrystalline silicon layer, a dielectric layer, and a single crystal semiconductor device layer. The multilayer structure is prepared in a manner that reduces wafer bow.

16 Claims, 4 Drawing Sheets

Related U.S. Application Data

15/554,034, filed as application No. PCT/US2016/019464 on Feb. 25, 2016, now Pat. No. 10,283,402.

(60) Provisional application No. 62/127,418, filed on Mar. 3, 2015.

(51) Int. Cl.
*H01L 21/02* (2006.01)
*H01L 21/762* (2006.01)

(52) U.S. Cl.
CPC .. *H01L 21/02488* (2013.01); *H01L 21/02513* (2013.01); *H01L 21/02532* (2013.01); *H01L 21/02639* (2013.01); *H01L 21/763* (2013.01); *H01L 21/76251* (2013.01); *H01L 27/1203* (2013.01)

(56) References Cited

U.S. PATENT DOCUMENTS

| | | | |
|---|---|---|---|
| 4,760,036 A * | 7/1988 | Schubert | H01L 21/76248 117/89 |
| 4,773,964 A * | 9/1988 | Haond | C30B 13/34 117/45 |
| 4,968,384 A | 11/1990 | Asano | |
| 5,094,714 A * | 3/1992 | Nishimura | C30B 13/00 117/43 |
| 5,189,500 A | 2/1993 | Kusunoki | |
| 6,043,138 A | 3/2000 | Ibok | |
| 6,204,205 B1 | 3/2001 | Yu et al. | |
| 6,373,113 B1 | 4/2002 | Gardner et al. | |
| 6,479,166 B1 | 11/2002 | Heuer et al. | |
| 6,562,127 B1 | 5/2003 | Kud et al. | |
| 6,624,047 B1 | 9/2003 | Sakaguchi et al. | |
| 7,868,419 B1 | 1/2011 | Kerr et al. | |
| 7,879,699 B2 | 2/2011 | Schulze et al. | |
| 7,915,716 B2 | 3/2011 | Pisigan et al. | |
| 8,058,137 B1 | 11/2011 | Or-Bach et al. | |
| 8,076,750 B1 | 12/2011 | Kerr et al. | |
| 8,466,036 B2 | 6/2013 | Brindle et al. | |
| 8,481,405 B2 | 7/2013 | Arriagada et al. | |
| 8,796,116 B2 | 8/2014 | Grabbe et al. | |
| 8,846,493 B2 | 9/2014 | Libbert et al. | |
| 8,859,393 B2 | 10/2014 | Ries et al. | |
| 9,202,711 B2 | 12/2015 | Liu et al. | |
| 9,716,136 B1 * | 7/2017 | Abou-Khalil | H01L 28/20 |
| 2002/0090758 A1 | 7/2002 | Henley et al. | |
| 2004/0005740 A1 | 1/2004 | Lochtefeld et al. | |
| 2004/0031979 A1 | 2/2004 | Lochtefeld et al. | |
| 2004/0108537 A1 | 6/2004 | Tiwari | |
| 2004/0213907 A1 | 10/2004 | Todd et al. | |
| 2005/0026432 A1 | 2/2005 | Atwater, Jr. et al. | |
| 2005/0153524 A1 | 7/2005 | Maa et al. | |
| 2005/0167002 A1 | 8/2005 | Ghyselen et al. | |
| 2006/0030124 A1 | 2/2006 | Maa et al. | |
| 2006/0033110 A1 | 2/2006 | Alam et al. | |
| 2006/0046431 A1 * | 3/2006 | Blietz | H01L 21/2007 438/455 |
| 2006/0226482 A1 | 10/2006 | Suvorov | |
| 2007/0032040 A1 | 2/2007 | Lederer | |
| 2007/0054466 A1 | 3/2007 | Hebras | |
| 2007/0200144 A1 | 8/2007 | Aspar et al. | |
| 2008/0171443 A1 | 7/2008 | Hebras | |
| 2008/0299744 A1 | 12/2008 | Yamazaki et al. | |
| 2009/0004833 A1 | 1/2009 | Suzuki et al. | |
| 2009/0014828 A1 | 1/2009 | Mizushima et al. | |
| 2009/0092810 A1 | 4/2009 | Lee et al. | |
| 2009/0117716 A1 | 5/2009 | Shimomura et al. | |
| 2009/0278233 A1 | 11/2009 | Pinnington et al. | |
| 2009/0321829 A1 | 12/2009 | Nguyen et al. | |
| 2011/0174362 A1 | 7/2011 | Tanner et al. | |
| 2011/0298083 A1 | 12/2011 | Yoneda | |
| 2012/0091587 A1 | 4/2012 | Or-Bach et al. | |
| 2012/0161310 A1 | 6/2012 | Brindle et al. | |
| 2012/0238070 A1 | 9/2012 | Libbert et al. | |
| 2012/0267681 A1 | 10/2012 | Nemoto et al. | |
| 2013/0120951 A1 | 5/2013 | Zuo et al. | |
| 2013/0122672 A1 | 5/2013 | Or-Bach et al. | |
| 2013/0168835 A1 | 7/2013 | Botula et al. | |
| 2013/0193445 A1 | 8/2013 | Dennard et al. | |
| 2013/0294038 A1 | 11/2013 | Landru et al. | |
| 2013/0344680 A1 | 12/2013 | Arriagada et al. | |
| 2014/0042598 A1 | 2/2014 | Kitada et al. | |
| 2014/0070215 A1 | 3/2014 | Bedell et al. | |
| 2014/0084290 A1 * | 3/2014 | Allibert | H01L 21/76254 438/479 |
| 2014/0120654 A1 | 5/2014 | Fujii et al. | |
| 2014/0124902 A1 | 5/2014 | Botula et al. | |
| 2014/0273405 A1 | 9/2014 | Liu et al. | |
| 2015/0004778 A1 | 1/2015 | Botula et al. | |
| 2015/0115480 A1 | 4/2015 | Peidous et al. | |
| 2015/0112308 A1 | 7/2015 | Peidous | |
| 2017/0033002 A1 | 2/2017 | Meguro et al. | |
| 2017/0345663 A1 | 11/2017 | Ishizuka et al. | |
| 2018/0033681 A1 * | 2/2018 | Ishikawa | H01L 21/3226 |

FOREIGN PATENT DOCUMENTS

| | | |
|---|---|---|
| EP | 2426701 A1 | 7/2012 |
| EP | 2503592 A1 | 9/2012 |
| EP | 2579303 A1 | 10/2013 |
| JP | H01315144 A | 12/1989 |
| JP | 2012253364 A | 12/2012 |
| WO | 2009120407 A2 | 10/2009 |
| WO | 2012127006 A1 | 9/2012 |
| WO | 2015112308 A1 | 7/2015 |
| WO | 2015119742 A1 | 8/2015 |

OTHER PUBLICATIONS

Lederer, D. et al., Enhanced High resistivity SOI wafers for RF Applications, 2004, IEEE International SOI Conference, Oct. 2004, pp. 46-47.

Lederer D. et al., New Substrate Passivation Method Dedicated to HR SOI Wafer Fabrication With Increased Substrate Resistivity, IEEE Electron Device Letters, Nov. 2005, pp. 805-807, vol. 26, No. 11.

Lederer, D. et al., Performance of SOI devices transferred onto passivated HR SOI substrates using a layer transfer technique, 2006, IEEE international SOI Conference Proceedings, 2006, pp. 29-30.

Kerr, Daniel C., Identification of RF harmonic distortion of Si substrates and its reduction using a trap-rich layer, IEEE (IEEE Topical Meeting), 2008, pp. 151-154.

Blicher, Adolph, Field-Effect and Bipolar Power Transistor Physics, Book, 1981, pp. 61-64, Academic Press, Inc.

Morkc, Hadis, Nanoheteroepitaxy and nano-ELO; Handbook of Nitride Semiconductors and Devices, Materials Properties, Physicsm and Growth, 2009, Wiley, pp. 564-569, vol. 1, Chapter 3.5.5.3.

Zamir, S. et al., Reduction of cracks in GaN films on Si-on-insulator by lateral confined epitaxy, Journal of Crystal Growth, Elsevier Amsterdam, NL, Sep. 2002, pp. 375-380, vol. 243, No. 3-4.

Gao, Min, et al., A transmission electron microscopy study of microstructural defects in proton implanted silicon, Journal of Applied Physics, Oct. 15, 1996 American Institute of Physcis, pgp. 4767-4769, vol. 70, No. 8.

Gao, Min, et al,. Two-dimensional network of dislocations and nanocavities in hydrogen-implanted and two-step annealed silicon, Applied Physcis Letters, American Institute of Physics May 18, 1998, pp. 2544-2546, vol. 72, No. 20.

Lu, Hongqiang et al., Characterization of methyl-doped silicon oxide film deposited using Flowfil(TM) chemical vapor deposition technology, Journal of Vacuum Science and Technology, Part B, May 2002, pp. 828-833, vol. 20, No. 3, Melville, New York.

Tong, Q. Y. et al., Semiconductor wafer bonding: recent developments, Materials Chemistry and Physics, Mar. 1994, pp. 101/127, vol. 37, No. 2, Elsevier Sequoia.

International Search Report and Written Opinion prepared by the

(56) References Cited

OTHER PUBLICATIONS

International Searching Authority regarding PCT/US2016/019464 dated Jul. 13, 2016; pp. 1-18.

* cited by examiner

METHOD OF DEPOSITING CHARGE TRAPPING POLYCRYSTALLINE SILICON FILMS ON SILICON SUBSTRATES WITH CONTROLLABLE FILM STRESS

CROSS-REFERENCE TO RELATED APPLICATION

This Application is a divisional application of U.S. application Ser. No. 16/186,683, filed Nov. 12, 2018, the disclosure of which is hereby incorporated by reference in its entirety. U.S. application Ser. No. 16/186,683 is continuation application of U.S. application Ser. No. 15/554,034, filed Aug. 28, 2017 and granted as U.S. Pat. No. 10,283,402 B2, the disclosure of which is hereby incorporated by reference in its entirety. U.S. application Ser. No. 15/554,034 is a National Stage application of International Application No. PCT/US2016/019464, filed on Feb. 25, 2016, the disclosure of which is hereby incorporated by reference in its entirety. International Application No. PCT/US2016/019464 claims priority to U.S. Provisional patent application Ser. No. 62/127,418 filed on Mar. 3, 2015, the disclosure of which is hereby incorporated by reference in its entirety.

THE FIELD OF THE INVENTION

The present invention generally relates to the field of semiconductor wafer manufacture. More specifically, the present invention relates to a method for forming a semiconductor-on-insulator (e.g., silicon-on-insulator) structure comprising a charge trapping layer.

BACKGROUND OF THE INVENTION

Semiconductor wafers are generally prepared from a single crystal ingot (e.g., a silicon ingot) which is trimmed and ground to have one or more flats or notches for proper orientation of the wafer in subsequent procedures. The ingot is then sliced into individual wafers. While reference will be made herein to semiconductor wafers constructed from silicon, other materials may be used to prepare semiconductor wafers, such as germanium, silicon carbide, silicon germanium, or gallium arsenide.

Semiconductor wafers (e.g., silicon wafers) may be utilized in the preparation of composite layer structures. A composite layer structure (e.g., a semiconductor-on-insulator, and more specifically, a silicon-on-insulator (SOI) structure) generally comprises a handle wafer or layer, a device layer, and an insulating (i.e., dielectric) film (typically an oxide layer) between the handle layer and the device layer. Generally, the device layer is between 0.01 and 20 micrometers thick, such as between 0.05 and 20 micrometers thick. In general, composite layer structures, such as silicon-on-insulator (SOI), silicon-on-sapphire (SOS), and silicon-on-quartz, are produced by placing two wafers in intimate contact, followed by a thermal treatment to strengthen the bond.

After thermal anneal, the bonded structure undergoes further processing to remove a substantial portion of the donor wafer to achieve layer transfer. For example, wafer thinning techniques, e.g., etching or grinding, may be used, often referred to as back etch SOI (i.e., BESOI), wherein a silicon wafer is bound to the handle wafer and then slowly etched away until only a thin layer of silicon on the handle wafer remains. See, e.g., U.S. Pat. No. 5,189,500, the disclosure of which is incorporated herein by reference as if set forth in its entirety. This method is time-consuming and costly, wastes one of the substrates and generally does not have suitable thickness uniformity for layers thinner than a few microns.

Another common method of achieving layer transfer utilizes a hydrogen implant followed by thermally induced layer splitting. Particles (e.g., hydrogen atoms or a combination of hydrogen and helium atoms) are implanted at a specified depth beneath the front surface of the donor wafer. The implanted particles form a cleave plane in the donor wafer at the specified depth at which they were implanted. The surface of the donor wafer is cleaned to remove organic compounds deposited on the wafer during the implantation process.

The front surface of the donor wafer is then bonded to a handle wafer to form a bonded wafer through a hydrophilic bonding process. Prior to bonding, the donor wafer and/or handle wafer are activated by exposing the surfaces of the wafers to plasma containing, for example, oxygen or nitrogen. Exposure to the plasma modifies the structure of the surfaces in a process often referred to as surface activation, which activation process renders the surfaces of one or both of the donor water and handle wafer hydrophilic. The wafers are then pressed together, and a bond is formed there between. This bond is relatively weak, and must be strengthened before further processing can occur.

In some processes, the hydrophilic bond between the donor wafer and handle wafer (i.e., a bonded wafer) is strengthened by heating or annealing the bonded wafer pair. In some processes, wafer bonding may occur at low temperatures, such as between approximately 300° C. and 500° C. In some processes, wafer bonding may occur at high temperatures, such as between approximately 800° C. and 1100° C. The elevated temperatures cause the formation of covalent bonds between the adjoining surfaces of the donor wafer and the handle wafer, thus solidifying the bond between the donor wafer and the handle wafer. Concurrently with the heating or annealing of the bonded wafer, the particles earlier implanted in the donor wafer weaken the cleave plane.

A portion of the donor wafer is then separated (i.e., cleaved) along the cleave plane from the bonded wafer to form the SOI wafer. Cleaving may be carried out by placing the bonded wafer in a fixture in which mechanical force is applied perpendicular to the opposing sides of the bonded wafer in order to pull a portion of the donor wafer apart from the bonded wafer. According to some methods, suction cups are utilized to apply the mechanical force. The separation of the portion of the donor wafer is initiated by applying a mechanical wedge at the edge of the bonded wafer at the cleave plane in order to initiate propagation of a crack along the cleave plane. The mechanical force applied by the suction cups then pulls the portion of the donor wafer from the bonded wafer, thus forming an SOI wafer.

According to other methods, the bonded pair may instead be subjected to an elevated temperature over a period of time to separate the portion of the donor wafer from the bonded wafer. Exposure to the elevated temperature causes initiation and propagation of a crack along the cleave plane, thus separating a portion of the donor wafer. This method allows for better uniformity of the transferred layer and allows recycle of the donor wafer, but typically requires heating the implanted and bonded pair to temperatures approaching 500° C.

The use of high resistivity semiconductor-on-insulator (e.g., silicon-on-insulator) wafers for RF related devices such as antenna switches offers benefits over traditional substrates in terms of cost and integration. To reduce parasitic power loss and minimize harmonic distortion inherent when using conductive substrates for high frequency applications it is necessary, but not sufficient, to use substrate wafers with a high resistivity. Accordingly, the resistivity of the handle wafer for an RF device is generally greater than about 500 Ohm-cm. With reference now to FIG. 1, a silicon on insulator structure 2 comprises a very high resistivity silicon wafer 4, a buried oxide (BOX) layer 6, and a silicon device layer 10. Such a substrate is prone to formation of high conductivity charge inversion or accumulation layers 12 at the BOX/handle interface causing generation of free carriers (electrons or holes), which reduce the effective resistivity of the substrate and give rise to parasitic power losses and device nonlinearity when the devices are operated at RF frequencies. These inversion/accumulation layers can be due to BOX fixed charge, oxide trapped charge, interface trapped charge, and even DC bias applied to the devices themselves.

A method is required therefore to trap the charge in any induced inversion or accumulation layers so that the high resistivity of the substrate is maintained even in the very near surface region. It is known that charge trapping layers (CTL) between the high resistivity handle substrates and the buried oxide (BOX) may improve the performance of RF devices fabricated using SOI wafers. A number of methods have been suggested to form these high interface trap layers. For example, with reference now to FIG. 2, one of the method of creating a semiconductor-on-insulator 20 (e.g., a silicon-on-insulator, or SOI) with a CTL for RF device applications is based on depositing an undoped polycrystalline silicon film 28 on a silicon substrate having high resistivity 22 and then forming a stack of oxide 24 and top silicon layer 26 on it. A polycrystalline silicon layer 28 acts as a high defectivity layer between the silicon substrate 22 and the buried oxide layer 24. See FIG. 2, which depicts a polycrystalline silicon film for use as a charge trapping layer 28 between a high resistivity substrate 22 and the buried oxide layer 24 in a silicon-on-insulator structure 20. An alternative method is the implantation of heavy ions to create a near surface damage layer. Devices, such as radiofrequency devices, are built in the top silicon layer 26.

It has been shown in academic studies that the polycrystalline silicon layer in between of the oxide and substrate improves the device isolation, decreases transmission line losses, and reduces harmonic distortions. See, for example: H. S. Gamble, et al. "Low-loss CPW lines on surface stabilized high resistivity silicon," *Microwave Guided Wave Lett.*, 9(10), pp. 395-397, 1999; D. Lederer, R. Lobet and J.-P. Raskin, "Enhanced high resistivity SOI wafers for RF applications," *IEEE Intl. SOI Conf*, pp. 46-47, 2004; D. Lederer and J.-P. Raskin, "New substrate passivation method dedicated to high resistivity SOI wafer fabrication with increased substrate resistivity," *IEEE Electron Device Letters*, vol. 26, no. 11, pp. 805-807, 2005; D. Lederer, B. Aspar, C. Laghae and J.-P. Raskin, "Performance of RF passive structures and SOI MOSFETs transferred on a passivated HR SOI substrate," *IEEE International SOI Conference*, pp. 29-30, 2006; and Daniel C. Kerr et al. "Identification of RF harmonic distortion on Si substrates and its reduction using a trap-rich layer", Silicon Monolithic Integrated Circuits in RF Systems, 2008. SiRF 2008 (IEEE Topical Meeting), pp. 151-154, 2008.

SUMMARY OF THE INVENTION

Briefly, the present invention is directed to a method of preparing a multilayer structure. The method comprises: forming a semiconductor oxide layer, a semiconductor nitride layer, or a semiconductor oxynitride layer in interfacial contact with a front surface of a single crystal semiconductor handle substrate, the single crystal semiconductor handle substrate comprising two major, generally parallel surfaces, one of which is the front surface of the single crystal semiconductor handle substrate and the other of which is a back surface of the single crystal semiconductor handle substrate, a circumferential edge joining the front and back surfaces of the single crystal semiconductor handle substrate, a central plane between the front surface and the back surface of the single crystal semiconductor handle substrate, and a bulk region between the front and back surfaces of the single crystal semiconductor handle substrate, wherein the single crystal semiconductor handle substrate has a minimum bulk region resistivity of at least about 500 ohm-cm; annealing the single crystal semiconductor handle substrate comprising the semiconductor oxide layer, the semiconductor nitride layer, or the semiconductor oxynitride layer in interfacial contact with the front surface thereof in an ambient atmosphere comprising a gas selected from the group consisting of hydrogen, hydrogen chloride, chlorine, and any combination thereof; depositing a polycrystalline silicon layer on the semiconductor oxide layer, the semiconductor nitride layer, or the semiconductor oxynitride layer in interfacial contact with the front surface the single crystal semiconductor handle substrate, wherein the polycrystalline silicon layer is deposited by chemical vapor deposition; and bonding a dielectric layer on a front surface of a single crystal semiconductor donor substrate to the polycrystalline silicon layer of the single crystal semiconductor handle substrate to thereby form a bonded structure, wherein the single crystal semiconductor donor substrate comprises two major, generally parallel surfaces, one of which is the front surface of the semiconductor donor substrate and the other of which is a back surface of the semiconductor donor substrate, a circumferential edge joining the front and back surfaces of the semiconductor donor substrate, and a central plane between the front and back surfaces of the semiconductor donor substrate.

The invention is further directed to a method of preparing a multilayer structure. The method comprises: forming a semiconductor oxide layer, a semiconductor nitride layer, or a semiconductor oxynitride layer in interfacial contact with a front surface of a single crystal semiconductor handle substrate, the single crystal semiconductor handle substrate comprising two major, generally parallel surfaces, one of which is the front surface of the single crystal semiconductor handle substrate and the other of which is a back surface of the single crystal semiconductor handle substrate, a circumferential edge joining the front and back surfaces of the single crystal semiconductor handle substrate, a central plane between the front surface and the back surface of the single crystal semiconductor handle substrate, and a bulk region between the front and back surfaces of the single crystal semiconductor handle substrate, wherein the single crystal semiconductor handle substrate has a minimum bulk region resistivity of at least about 500 ohm-cm; annealing the single crystal semiconductor handle substrate comprising the semiconductor oxide layer, the semiconductor nitride layer, or the semiconductor oxynitride layer in interfacial contact with the front surface thereof in an ambient atmosphere comprising a gas selected from the group consisting of hydrogen, hydrogen chloride, chlorine, and any combination thereof; exposing the single crystal semiconductor handle substrate comprising the semiconductor oxide layer, the semiconductor nitride layer, or the semiconductor oxynitride layer in interfacial contact with the front surface thereof to an ambient atmosphere comprising a silicon precursor at a temperature of at least about 850° C. to thereby deposit a polycrystalline silicon layer on the semiconductor oxide layer, the semiconductor nitride layer, or the semiconductor oxynitride layer; and bonding a dielectric layer on a front surface of a single crystal semiconductor donor substrate to the polycrystalline silicon layer of the single crystal semiconductor handle substrate to thereby form a bonded structure, wherein the single crystal semiconductor donor substrate comprises two major, generally parallel surfaces, one of which is the front surface of the semiconductor donor substrate and the other of which is a back surface of the semiconductor donor substrate, a circumferential edge joining the front and back surfaces of the semiconductor donor substrate, and a central plane between the front and back surfaces of the semiconductor donor substrate.

The invention is further directed to a multilayer structure comprising: a single crystal semiconductor handle substrate comprising two major, generally parallel surfaces, one of which is a front surface of the single crystal semiconductor handle substrate and the other of which is a back surface of the single crystal semiconductor handle substrate, a circumferential edge joining the front and back surfaces of the single crystal semiconductor handle substrate, a central plane between the front surface and the back surface of the single crystal semiconductor handle substrate, and a bulk region between the front and back surfaces of the single crystal semiconductor handle substrate, wherein the single crystal semiconductor handle substrate has a minimum bulk region resistivity of at least about 500 ohm-cm; a textured semiconductor oxide layer, a textured semiconductor nitride layer, or a textured semiconductor oxynitride layer in interfacial contact in interfacial contact with the front surface of the single crystal semiconductor handle substrate, wherein the textured semiconductor oxide layer, the textured semiconductor nitride layer, or the textured semiconductor oxynitride layer comprises holes having sizes between about 5 nanometers and about 1000 nanometers; a polycrystalline silicon layer in interfacial contact with the textured semiconductor oxide layer, the textured semiconductor nitride layer, or the textured semiconductor oxynitride layer; a dielectric layer in interfacial contact with the polycrystalline silicon layer; and a single crystal semiconductor device layer in interfacial contact with the dielectric layer, wherein the multilayer structure has wafer bow as measured by at least three points on the front surface of the semiconductor device layer and/or the back surface of the single crystal semiconductor handle substrate of less than about 80 micrometers.

Other objects and features of this invention will be in part apparent and in part pointed out hereinafter.

DETAILED DESCRIPTION OF THE EMBODIMENT(S) OF THE INVENTION

According to the present invention, a method is provided for producing a charge trapping layer on a single crystal semiconductor handle substrate, e.g., a single crystal semiconductor handle wafer. The single crystal semiconductor handle wafer comprising the charge trapping layer is useful in the production of a semiconductor-on-insulator (e.g., silicon-on-insulator) structure. According to the present invention, the charge trapping layer in the single crystal semiconductor handle wafer is formed at the region near the oxide interface in a semiconductor-on-insulator structure, i.e., near the buried oxide layer or BOX. Advantageously, the method of the present invention provides a highly defective charge trapping layer that is stable against thermal processing, such as subsequent thermal process steps of semiconductor-on-insulator substrate and device manufacture. Advantageously, the method of the present invention yields a clean polycrystalline silicon charge trapping layer comprising less contamination than conventional means of preparing charge trapping layers. Advantageously, the method of the present invention yields a semiconductor-on-insulator structure comprising a handle substrate prepared by the method of the present invention having reduced warp and bow.

Figure 1:
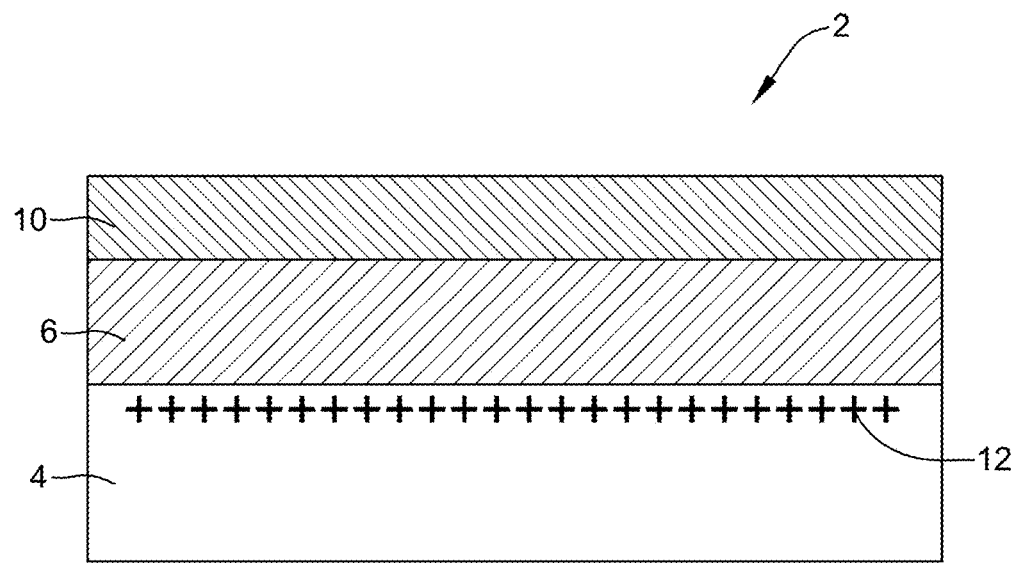
FIG. 1 is a depiction of a silicon-on-insulator wafer comprising a high resistivity substrate and a buried oxide layer.
Figure 2:
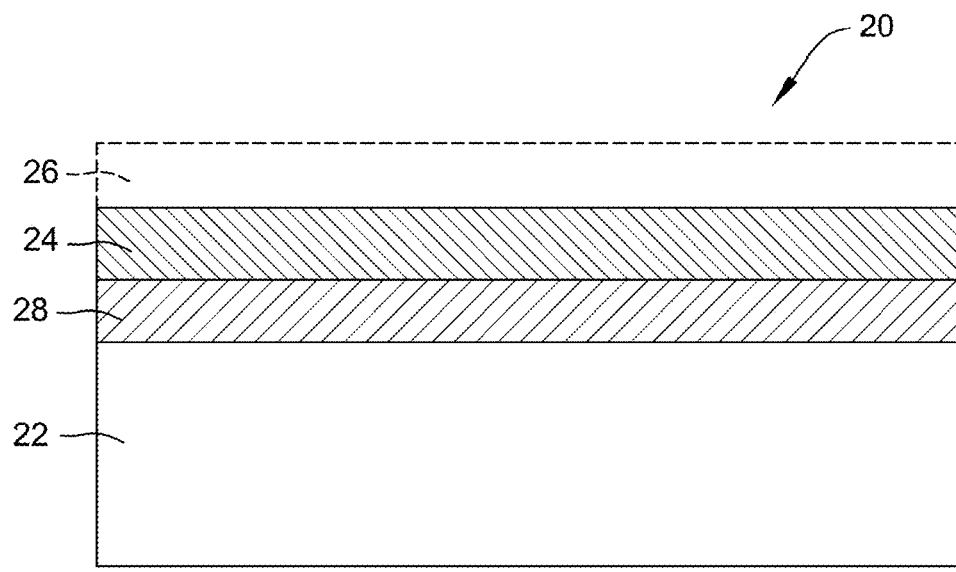
FIG. 2 is a depiction of a silicon-on-insulator wafer comprising a polycrystalline silicon charge trapping layer between a high resistivity substrate and a buried oxide layer.
Figure 3:
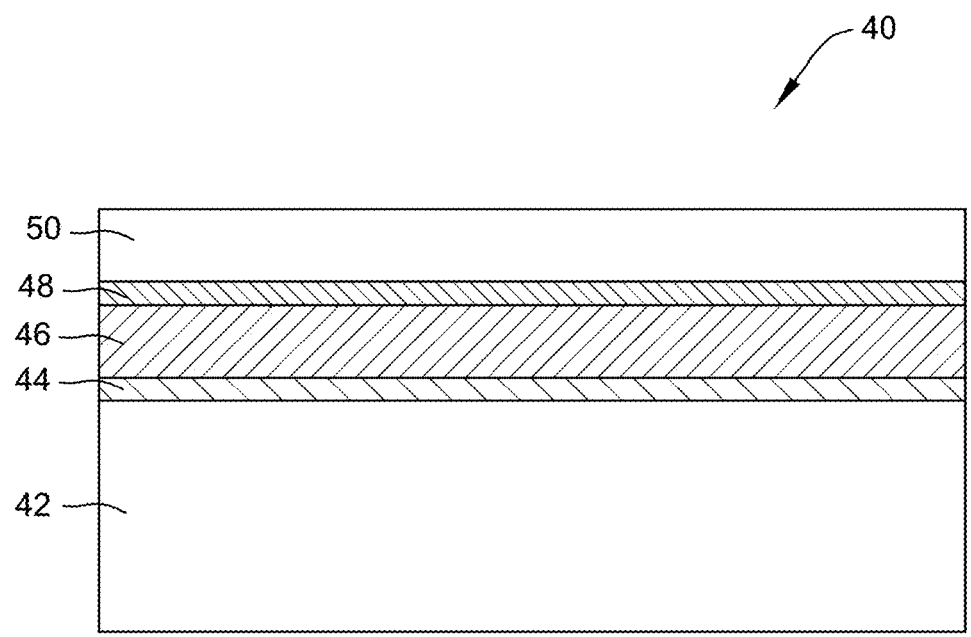
FIG. 3 is a depiction of a silicon-on-insulator wafer comprising a silicon oxide layer and a polycrystalline silicon charge trapping layer between a high resistivity substrate and a buried oxide layer.

The handle substrate prepared according to the method of the present invention is suitable for use in the manufacture of a semiconductor-on-insulator (e.g., silicon-on-insulator) structure. With reference to FIG. 3, layer transfer is performed by conventional techniques thus creating a semiconductor-on-insulator (e.g., silicon-on-insulator) structure 40 of the present invention comprising at least the following layers or regions: the handle substrate 42, a semiconductor oxide layer 44, a charge trapping layer 46, a dielectric layer 48 (e.g., buried oxide) and a single crystal semiconductor device layer 50 (e.g., a silicon layer derived from a single crystal silicon donor substrate). In some embodiments, the semiconductor-on-insulator (e.g., silicon-on-insulator) structure 40 of the present invention comprises at least the following layers or regions: the handle substrate 42, a semiconductor nitride or oxynitride layer 44, a charge trapping layer 46, a dielectric layer 48 (e.g., buried oxide) and a single crystal semiconductor device layer 50 (e.g., a silicon layer derived from a single crystal silicon donor substrate).

The substrates for use in the method and structures of the present invention include a semiconductor handle substrate 42, e.g., a single crystal semiconductor handle wafer and a semiconductor donor substrate, e.g., a single crystal semiconductor donor wafer. The semiconductor device layer 50 in a semiconductor-on-insulator composite structure 40 is derived from the single crystal semiconductor donor wafer. The semiconductor device layer 50 may be transferred onto the semiconductor handle substrate 42 by wafer thinning techniques such as etching a semiconductor donor substrate or by cleaving a semiconductor donor substrate comprising a damage plane. In general, the single crystal semiconductor handle wafer and single crystal semiconductor donor wafer comprise two major, generally parallel surfaces. One of the parallel surfaces is a front surface of the substrate, and the other parallel surface is a back surface of the substrate. The substrates comprise a circumferential edge joining the front and back surfaces, a bulk region between the front and back surfaces, and a central plane between the front and back surfaces. The substrates additionally comprise an imaginary central axis perpendicular to the central plane and a radial length that extends from the central axis to the circumferential edge. In addition, because semiconductor substrates, e.g., silicon wafers, typically have some total thickness variation (TTV), warp, and bow, the midpoint between every point on the front surface and every point on the back surface may not precisely fall within a plane. As a practical matter, however, the TTV, warp, and bow are typically so slight that to a close approximation the midpoints can be said to fall within an imaginary central plane which is approximately equidistant between the front and back surfaces.

Prior to any operation as described herein, the front surface and the back surface of the substrate may be substantially identical. A surface is referred to as a "front surface" or a "back surface" merely for convenience and generally to distinguish the surface upon which the operations of method of the present invention are performed. In the context of the present invention, a "front surface" of a single crystal semiconductor handle substrate, e.g., a single crystal silicon handle wafer, refers to the major surface of the substrate that becomes an interior surface of the bonded structure. With reference to FIG. 3, the charge trapping layer 46 of the present invention is formed in interfacial contact with a semiconductor oxide layer 44, which is formed on the front surface of the single crystal semiconductor handle substrate 42. A "back surface" of a single crystal semiconductor handle substrate 42, e.g., a handle wafer, refers to the major surface that becomes an exterior surface of the semiconductor-on-insulator composite structure 40. Similarly, a "front surface" of a single crystal semiconductor donor substrate, e.g., a single crystal silicon donor wafer, refers to the major surface of the single crystal semiconductor donor substrate that becomes an interior surface of the semiconductor-on-insulator composite structure 40. The front surface of a single crystal semiconductor donor substrate often comprises a dielectric layer, e.g., a silicon dioxide layer, which forms the buried oxide (BOX) layer in the final structure. A "back surface" of a single crystal semiconductor donor substrate, e.g., a single crystal silicon donor wafer, refers to the major surface that becomes an exterior surface of the semiconductor-on-insulator composite structure 40. Upon completion of conventional bonding and wafer thinning steps, the single crystal semiconductor donor substrate forms the semiconductor device layer 50 of the semiconductor-on-insulator (e.g., silicon-on-insulator) composite structure 40.

The semiconductor handle substrate 42 and the device layer 50 may comprise single crystal semiconductor material. In preferred embodiments, the semiconductor material may be selected from the group consisting of silicon, silicon carbide, sapphire, aluminum nitride, silicon germanium, gallium arsenide, gallium nitride, indium phosphide, indium gallium arsenide, germanium, and combinations thereof. The semiconductor handle substrate 42 and the device layer 50 may comprise the same semiconductor material, or they may be different. In view thereof, semiconductor-on-insulator composite structure 40 may comprise, e.g., silicon-on-insulator, sapphire-on-insulator, aluminum nitride-on-insulator, and other combinations. The single crystal semiconductor wafers, e.g., the single crystal silicon handle wafer and single crystal silicon donor wafer, of the present invention typically have a nominal diameter of at least about 150 mm, at least about 200 mm, at least about 300 mm, or at least about 450 mm. Wafer thicknesses may vary from about 250 micrometers to about 1500 micrometers, such as between about 300 micrometers and about 1000 micrometers, suitably within the range of about 500 micrometers to about 1000 micrometers. In some specific embodiments, the wafer thickness may be about 725 micrometers.

In particularly preferred embodiments, the single crystal semiconductor wafers comprise single crystal silicon wafers which have been sliced from a single crystal ingot grown in accordance with conventional Czochralski crystal growing methods or float zone growing methods. Such methods, as well as standard silicon slicing, lapping, etching, and polishing techniques are disclosed, for example, in F. Shimura, Semiconductor Silicon Crystal Technology, Academic Press, 1989, and Silicon Chemical Etching, (J. Grabmaier ed.) Springer-Verlag, N.Y., 1982 (incorporated herein by reference). Preferably, the wafers are polished and cleaned by standard methods known to those skilled in the art. See, for example, W. C. O'Mara et al., Handbook of Semiconductor Silicon Technology, Noyes Publications. If desired, the wafers can be cleaned, for example, in a standard SC1/SC2 solution. In some embodiments, the single crystal silicon wafers of the present invention are single crystal silicon wafers which have been sliced from a single crystal ingot grown in accordance with conventional Czochralski ("Cz") crystal growing methods, typically having a nominal diameter of at least about 150 mm, at least about 200 mm, at least about 300 mm, or at least about 450 mm. Preferably, both the single crystal silicon handle wafer and the single crystal silicon donor wafer have mirror-polished front surface finishes that are free from surface defects, such as scratches, large particles, etc. Wafer thickness may vary from about 250 micrometers to about 1500 micrometers, such as between about 300 micrometers and about 1000 micrometers, suitably within the range of about 500 micrometers to about 1000 micrometers. In some specific embodiments, the wafer thickness may be about 725 micrometers.

In some embodiments, the single crystal semiconductor handle substrate and the single crystal semiconductor donor substrate, i.e., single crystal semiconductor handle wafer and single crystal semiconductor donor wafer, comprise interstitial oxygen in concentrations that are generally achieved by the Czochralski-growth method. In some embodiments, the semiconductor wafers comprise oxygen in a concentration between about 4 PPMA and about 18 PPMA. In some embodiments, the semiconductor wafers comprise oxygen in a concentration between about 10 PPMA and about 35 PPMA. Preferably, the single crystal silicon handle wafer comprises oxygen in a concentration of no greater than about 10 ppma. Interstitial oxygen may be measured according to SEMI MF 1188-1105.

With reference again to FIG. 3, in some embodiments, the single crystal semiconductor handle substrate 42, e.g., a single crystal silicon handle wafer, has a relatively high minimum bulk resistivity. High resistivity wafers are generally sliced from single crystal ingots grown by the Czochralski method or float zone method. High resistivity wafers may comprise electrically active dopants, such as boron (p type), gallium (p type), phosphorus (n type), antimony (n type), and arsenic (n type), in generally very low concentrations. Cz-grown silicon wafers may be subjected to a thermal anneal at a temperature ranging from about 600° C. to about 1000° C. in order to annihilate thermal donors caused by oxygen that are incorporated during crystal growth. In some embodiments, the single crystal semiconductor handle wafer has a minimum bulk resistivity of at least 100 Ohm-cm, or even at least about 500 Ohm-cm, such as between about 100 Ohm-cm and about 100,000 Ohm-cm, or between about 500 Ohm-cm and 100,000 Ohm-cm, or between about 1000 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 Ohm-cm, between about 2000 Ohm-cm and about 10,000 Ohm-cm, between about 3000 Ohm-cm and about 10,000 Ohm-cm, or between about 3000 Ohm-cm and about 5,000 Ohm-cm. Methods for preparing high resistivity wafers are known in the art, and such high resistivity wafers may be obtained from commercial suppliers, such as SunEdison Semiconductor Ltd. (St. Peters, Mo.; formerly MEMC Electronic Materials, Inc.).

In some embodiments, the high resistivity single crystal semiconductor handle substrate 42 comprises a p-type or an n-type dopant. Suitable dopants include boron (p type), gallium (p type), phosphorus (n type), antimony (n type), and arsenic (n type). In some embodiments, the single crystal semiconductor handle substrate comprises a p-type dopant. In some embodiments, the single crystal semiconductor handle substrate is a single crystal silicon wafer comprising a p-type dopant, such as boron. The boron dopant is present in a relatively low concentration, e.g., less than $1\times10^{14}$ atoms/cm$^3$, preferably less than $1\times10^{13}$ atoms/cm$^3$, so as to obtain high resistivity handle substrates.

In some embodiments, the single crystal semiconductor handle substrate 42, e.g., a single crystal silicon handle wafer, has a relatively low minimum bulk resistivity, such as below about 100 ohm-cm, below about 50 ohm-cm, below about 1 ohm-cm, below about 0.1 ohm-cm, or even below about 0.01 ohm-cm. In some preferred embodiments, the single crystal semiconductor handle substrate 42 has a relatively low minimum bulk resistivity, such as below about 100 ohm-cm, or between about 1 ohm-cm and about 100 ohm-cm. Low resistivity wafers may comprise electrically active dopants, such as boron (p type), gallium (p type), phosphorus (n type), antimony (n type), and arsenic (n type).

In some embodiments, the single crystal semiconductor handle substrate 42 surface could be intentionally damaged by a sound blasting process or by a caustic etch.

According to the method of the present invention, the front surface of the single crystal semiconductor handle substrate 42 may be oxidized, such as by exposure to an oxidizing medium. Oxidation of the single crystal semiconductor handle substrate 42 forms a semiconductor oxide layer 44 on the front surface of the handle substrate 42. In some embodiments, the front surface of the single crystal semiconductor handle substrate 42 may comprise a semiconductor nitride or oxynitride layer. In some embodiments, the single crystal semiconductor handle substrate 42 may be exposed to air or ozone. In some embodiments, the single crystal semiconductor handle substrate 42 may be exposed to an aqueous solution comprising an oxidizing agent. An example of such an aqueous solution is an SC1 solution. In some embodiments, the single crystal semiconductor handle substrate 42 may be oxidized by thermal oxidation (in which some portion of the single crystal semiconductor material will be consumed) and/or CVD oxide deposition and/or by atomic layer deposition prior to deposition of the charge trapping layer.

In some embodiments, the front surface of the single crystal semiconductor handle substrate 42 may be subjected to a process, e.g., an oxidation process, to thereby grow a dielectric layer, such as a semiconductor oxide layer, a semiconductor nitride layer, or a semiconductor oxynitride layer. In some embodiments, the dielectric layer comprises silicon dioxide, which may be formed by oxidizing the front surface of the silicon handle substrate. This may be accomplished by thermal oxidation (in which some portion of the deposited semiconductor material film will be consumed) and/or CVD oxide deposition and/or atomic layer deposition. In some embodiments, the semiconductor handle substrate may be thermally oxidized in a furnace such as an ASM A400. The temperature may range from 750° C. to 1100° C. in an oxidizing ambient. The oxidizing ambient atmosphere can be a mixture of inert gas, such as Ar or N$_2$, and O$_2$. The oxygen content may vary from 1 to 10 percent, or higher. In some embodiments, the oxidizing ambient atmosphere may be up to 100% oxygen (a "dry oxidation"). In some embodiments, the oxidizing ambient atmosphere may be oxygen and ammonia. In some embodiments, the ambient atmosphere may comprise a mixture of inert gas, such as Ar or N$_2$, and oxidizing gases, such as O$_2$ and water vapor (a "wet oxidation"). In some embodiments, the ambient atmosphere may comprise a mixture of inert gas, such as Ar or N$_2$, and oxidizing gas, such as O$_2$ and water vapor (a "wet oxidation"), and a nitriding gas, such as ammonia. In some embodiments, the ambient atmosphere may comprise a mixture of inert gas, such as Ar or N$_2$, and a nitriding gas, such as ammonia. In an exemplary embodiment, semiconductor handle wafers may be loaded into a vertical furnace, such as an A400. The temperature is ramped to the oxidizing temperature with a mixture of N$_2$ and O$_2$. At the desired temperature water vapor is introduced into the gas flow. After the desired oxide thickness has been obtained, the water vapor and O$_2$ are turned off and the furnace temperature is reduced and wafers are unloaded from the furnace.

In some embodiments, the handle substrate 42 may be oxidized by exposure to an aqueous solution comprising an oxidizing agent, such as an SC1 solution or an SC2 solution. In some embodiments, the SC1 solution comprises 5 parts deionized water, 1 part aqueous NH$_4$OH (ammonium hydroxide. 29% by weight of NH$_3$), and 1 part of aqueous H$_2$O$_2$ (hydrogen peroxide, 30%). In some embodiments, the handle substrate may be oxidized by exposure to an aqueous solution comprising an oxidizing agent, such as an SC2 solution. In some embodiments, the SC2 solution comprises 5 parts deionized water, 1 part aqueous HCl (hydrochloric acid, 39% by weight), and 1 part of aqueous H$_2$O$_2$ (hydrogen peroxide, 30%).

In some embodiments, the handle substrate 42 is oxidized to provide a semiconductor oxide layer 44 in interfacial contact with the front surface layer of the substrate 42 having a thickness between about 0.1 nanometers and about 25 nanometers, such as between about 0.5 nanometers and about 5 nanometers, or between about 1 nanometer and about 5 nanometers.

After oxidation of the front surface of the single crystal semiconductor handle substrate 42 to form a semiconductor oxide layer 44 on the front surface of the handle substrate 42, the single crystal semiconductor handle substrate 42 comprising the semiconductor oxide layer 44 on the front surface thereof may be exposed to an ambient atmosphere comprising reducing agents and/or etching agents. Exposure to the ambient atmosphere comprising reducing agents and/or etching agents advantageously cleans the oxide layer on the substrate and texturizes the semiconductor oxide layer for subsequent polycrystalline silicon deposition. Wafer handling in the clean room may cause contaminants, such as organic contaminants and boron, aluminum, phosphorus, etc., to deposit on the surfaces of the handle substrate. The contaminants either disrupt the nucleation process of polycrystalline silicon film or become undesired dopants in Silicon that changes the substrate and polycrystalline silicon film resistivity, resulting in enhanced radiofrequency signal distortion and power loss. The ambient atmosphere comprising reducing agents and/or etching agents may clean these contaminants. According to the present invention, a reducing agent such as hydrogen reacts with common clean room contaminants such as Boron oxide, Aluminum oxide, etc., while an etching gas such as chlorine or hydrogen chloride reacts with aluminum, boron, and phosphorus to form volatile chloride products that are carried away from the silicon surface by the hydrogen gas. In the presence of silicon oxide, the carbon atoms in the organic contaminants replace silicon atoms and form carbon monoxide which is purged off the silicon surface by hydrogen carrier gas. Therefore, the bake/etch step prior to polycrystalline silicon deposition is advantageous for obtaining a pure and high-efficiency charge trapping layer. Additionally, the bake/etch process opens holes in the oxide layer to form a textured oxide structure and thus exposes the silicon surface to the silicon precursor during deposition of the polycrystalline silicon charge trapping layer. The density and size of the holes in the textured oxide can be well controlled by the temperature, time, and gas flows in the bake/etch step. Typically, the size of the holes can be controlled in the range of between about 5 nanometers and about 1000 nanometers, such as between about 5 nanometers and about 500 nanometers, or between about 5 nanometers and about 200 nanometers, which enables the engineering of the polycrystalline silicon grain size as well as the film stress. See FIG. 4, which shows an opening of −40 nm in the oxide that provides nucleation site for the polysilicon charge trapping layer. The textured oxide structure has to be well controlled so that a uniform density of holes is achieved across the wafer surface without losing the whole oxide layer. The residual oxide is critical to the thermal stability of the polycrystalline silicon charge trapping layer. In the subsequent thermal processes in SOI substrate and device fabrication, the polycrystalline silicon layer may through recrystallization that is facilitated by the direct contact of polycrystalline grains and the monocrystalline substrate. The residual oxide at the polysilicon and substrate interface effectively blocks the recrystallization process and prevents the polycrystalline silicon layer from turning into monocrystalline silicon that has no charge trapping function.

The cleaning/anneal step is advantageously performed in the same chamber, e.g., a CVD reaction chamber, in which the polycrystalline silicon charge trapping layer is deposited. The reducing atmosphere may additionally comprise an etchant to further enhance the wafer clean. Accordingly, the ambient atmosphere for wafer cleaning may comprise hydrogen, hydrogen chloride, chlorine, or any combination of hydrogen, hydrogen chloride, and chlorine. In some embodiments, the ambient atmosphere for wafer cleaning may comprise hydrogen and hydrogen chloride. In some embodiments, the ambient atmosphere for wafer cleaning may comprise hydrogen and chlorine. Additionally, the wafer clean may be performed at elevated temperature, such as greater than about 850° C., such as between about 850° C. and about 1100° C., or between about 850° C. and about 1000° C., preferably between 900° C. and 1000° C. The pressure inside the chamber may be atmospheric pressure or at a reduce temperature, such as between about 1 Torr and about 760 Torr, such as between about 1 Torr and about 400 Torr. At the desired temperature for cleaning, the wafer may be exposed to the ambient atmosphere comprising hydrogen, hydrogen chloride, chlorine, or any combination of hydrogen, hydrogen chloride, and chlorine for a duration between about 1 second and about 300 seconds, such as between about 5 seconds and about 60 seconds, or between about 10 seconds and about 40 seconds.

After formation of the semiconductor oxide layer 44 on the front surface of the single crystal semiconductor handle substrate 42 and wafer annealing and texturing, a polycrystalline silicon charge trapping layer 46 is next deposited in interfacial contact with the semiconductor oxide layer 44. In some embodiments, semiconductor material is deposited onto the semiconductor oxide layer 44 on the front surface of the single crystal semiconductor handle substrate 42. Semiconductor material suitable for use in forming a charge trapping layer 46 in a semiconductor-on-insulator device 40 is capable of forming a highly defective layer in the fabricated device. In some embodiments, the charge trapping layer comprises polycrystalline silicon. Polycrystalline material denotes a material comprising small crystals having random crystal orientations. Polycrystalline grains may be as small in size as about 20 nanometers, and the grain size generally ranges from between about 20 nanometers and about 1 micrometer, such as between about 0.3 micrometer and about 1 micrometer. According to the method of the present invention, the smaller the crystal grain size of polycrystalline material deposited the higher the defectivity in the charge trapping layer. The resistivity of the polycrystalline silicon charge trapping layer may be at least 100 Ohm-cm, at least about 500 Ohm-cm, at least about 1000 Ohm-cm, or even at least about 3000 Ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 Ohm-cm, between about 2000 Ohm-cm and about 10,000 Ohm-cm, between about 3000 Ohm-cm and about 10,000 Ohm-cm, or between about 3000 Ohm cm and about 8,000 Ohm-cm. Polycrystalline silicon may be deposited using metalorganic chemical vapor deposition (MOCVD), physical vapor deposition (PVD), chemical vapor deposition (CVD), low pressure chemical vapor deposition (LPCVD), plasma enhanced chemical vapor deposition (PECVD), or molecular beam epitaxy (MBE). In some embodiments, polycrystalline silicon is deposited by chemical vapor deposition. In some embodiments, polycrystalline silicon is deposited at elevated temperatures. In some embodiments, after the polycrystalline silicon is deposited, the handle substrate is subjected to a high temperature anneal. In some embodiments, a portion of polycrystalline silicon is deposited to thereby deposit a polycrystalline silicon seed layer having a thickness less than the final thickness of the charged trapping layer. The handle substrate comprising the polycrystalline seed layer is subjected to a high temperature anneal, which is followed by deposition of the rest of the charge trapping layer. In some embodiments, the fully deposited polycrystalline silicon charge trapping layer is subjected to a high temperature anneal in order to reduce film stress to a range between about 0 MPa and about 500 MPa, such as between about 0 MPa and about 100 MPa. The semiconductor oxide layer 44 contributes to the polycrystallinity of the charge trapping layer 46. Accordingly, if the semiconductor oxide layer 44 is not formed prior to deposition of the charge trapping layer 46, the deposited semiconductor material may assume the crystallinity of the underlying substrate 42, which is not preferred for a charge trapping layer.

In some embodiments, the semiconductor oxide layer is present on the handle substrate in order to form a polycrystalline silicon layer instead of epitaxial silicon layer in the charge trapping layer deposition step. The nucleation of polycrystalline silicon layer on the semiconductor oxide layer is realized by preferential etching of the semiconductor oxide layer in an ambient atmosphere comprising one or more of $H_2$, HCl, and, optionally, a silicon precursor. The etching and polycrystalline silicon layer deposition may occur sequentially in which the etching step occurs first, or simultaneously. Exemplary silicon precursors for inclusion in the etching ambient atmosphere or the ambient atmosphere for polycrystalline silicon deposition may be selected from among methyl silane, silicon tetrahydride (silane), trisilane, disilane, pentasilane, neopentasilane, tetrasilane, dichlorosilane ($SiH_2Cl_2$), trichlorosilane ($SiHCl_3$), silicon tetrachloride ($SiCl_4$), among others. Polycrystalline silicon growth starts from openings in the semiconductor oxide layer and adjacent nuclei merge into a solid film upon growth. By controlling the semiconductor oxide layer thickness and properties, like porosity, density, and chemical composition, the texture of the polycrystalline silicon layer can be engineered to meet different applications.

The material for deposition onto the front surface of the single crystal semiconductor handle wafer to thereby form the charge trapping layer may be deposited by metalorganic chemical vapor deposition (MOCVD), physical vapor deposition (PVD), chemical vapor deposition (CVD), low pressure chemical vapor deposition (LPCVD), plasma enhanced chemical vapor deposition (PECVD), or molecular beam epitaxy (MBE). In preferred embodiments, polycrystalline silicon is deposited by chemical vapor deposition. Silicon precursors for CVD include methyl silane, silicon tetrahydride (silane), trisilane, disilane, pentasilane, neopentasilane, tetrasilane, dichlorosilane ($SiH_2Cl_2$), trichlorosilane ($SiHCl_3$), silicon tetrachloride ($SiCl_4$), among others. In some preferred embodiments, the silicon precursor is selected from among silane, dichlorosilane ($SiH_2Cl_2$), and trichlorosilane ($SiHCl_3$). For example, polycrystalline silicon may be deposited onto the surface oxidation layer by CVD of silane, dichlorosilane ($SiH_2Cl_2$), and trichlorosilane ($SiHCl_3$) in a temperature greater than about 850° C., such as between about 850° C. and about 1100° C., or between about 850° C. and about 1000° C. The high temperature contributes, among other advantages, high growth rate, thereby contributing to throughput and cost reduction. CVD deposition rates may range be at least about 0.1 micrometer/minute, such as between about 0.1 micrometer/minute to about 10 micrometers/minute, or between about 0.1 micrometer/minute to about 2 micrometers/minute. Deposition of the polycrystalline silicon layer may continue until the layer has a thickness of at least about 0.1 micrometer, such as between about 0.1 micrometer and about 50 micrometers, such as between about 0.1 micrometer and about 20 micrometers, between about 0.1 micrometer and about 10 micrometers, between about 0.5 micrometer and about 5 micrometers, or between about 0.5 micrometer and about 3 micrometers, such as between about 1 micrometer and about 2 micrometers or between about 2 micrometers and about 5 micrometers. Deposition may occur at a pressure between about 1 Torr and about 760 Torr, such as between about 1 Torr and about 400 Torr.

In some embodiments, deposition of the polycrystalline silicon layer by chemical vapor deposition is interrupted after deposition of a polycrystalline silicon seed layer. The polycrystalline silicon seed layer may have a thickness less than the overall desired thickness of the final polycrystalline silicon charge trapping layer. Accordingly, the polycrystalline seed layer may be deposited to a thickness of less than 20 micrometers, less than 10 micrometers, less than 5 micrometers, less than 3 micrometers, less than 2 micrometers, or less than 1 micrometer, or less than 0.5 micrometer, such as between about 50 nanometers and about 20 micrometers, or between about 50 nanometers and about 10 micrometers, or between about 50 nanometers and about 5 micrometers, or between about 50 nanometers and about 3 micrometers, or between about 50 nanometers and about 2 micrometers, or between about 50 nanometers and about 1 micrometers, or between about 50 nanometers and about 500 nanometers, or between about 50 nanometers and about 200 nanometers. The thickness of the seed layer is set by the size of the polysilicon nuclei. To achieve effective stress release, the seed layer needs to cover the substrate surface while leaving voids smaller than 50 nm, which enables the access of $H_2$ to the interface between the polysilicon seed layer and oxide. $H_2$ reduces the interfacial oxide and promotes the diffusion of the atoms at the grain boundaries of the polysilicon seed layer to the substrate and thus releases the film stress. When the seed layer is thick enough to completely prevent $H_2$ access to the interfacial oxide, the subsequent annealing process is not able to release the film stress effectively. On the other hand, when the seed layer is not continuous and the opening area between two adjacent nuclei is wider than 50 nm, large nuclei are formed after the oxide layer is removed during the seed annealing process. The large nuclei will grow into large grains (i.e., diameter >1 um) at the end of polysilicon deposition, which reduces the trapping efficiency. Deposition may be interrupted by ceasing the flow of silicon precursors into the CVD chamber. After interruption of the deposition of polycrystalline silicon, the handle substrate comprising the polycrystalline seed layer may be annealed. Annealing the polycrystalline seed layer contributes to desirable charge trapping layer properties, such as obtaining a clean surface, a high purity film, a high resistivity film, desired nuclei size and uniformity, and reduction of residual film stress. In some embodiments, the polycrystalline silicon seed layer is subjected to a high temperature anneal in order to reduce film stress to a range between about 0 MPa and about 500 MPa, such as between about 0 MPa and about 100 MPa. The polycrystalline seed layer is annealed at a temperature greater than about 1000° C., such as between about 1000° C. and about 1200° C., or between about 1000° C. and about 1100° C. The seed layer may be annealed for a duration between about 1 second and about 300 seconds, such as between about 5 seconds and about 60 seconds, or between about 10 seconds and about 40 seconds. The ambient atmosphere for anneal may comprise hydrogen, hydrogen chloride, chlorine, or any combination of hydrogen, hydrogen chloride, and chlorine. The annealing step can be performed at reduced pressure or atmospheric pressure, such as between about 1 Torr and about 760 Torr, or between about 10 Torr and about 760 Torr. The grain size and the stress of the polycrystalline silicon film is controlled by the annealing temperature, duration, and gas flow. After the appropriate anneal duration, deposition by chemical vapor deposition of the polycrystalline silicon layer is resumed after cooling the single crystal semiconductor handle substrate to a temperature between about 850° C. and about 1000° C.

In some embodiments, the handle substrate comprising the polycrystalline silicon layer is annealed after deposition is complete. Annealing the polycrystalline seed layer contributes to desirable charge trapping layer properties, such as obtaining a clean surface, a high purity film, a high resistivity film, desired nuclei size and uniformity, and reduction of residual film stress. In some embodiments, the fully deposited polycrystalline silicon charge trapping layer is subjected to a high temperature anneal in order to reduce film stress to a range between about 0 MPa and about 500 MPa, such as between about 0 MPa and about 100 MPa. The handle substrate comprising the deposited polycrystalline silicon layer is at a temperature greater than about 1000° C., such as between about 1000° C. and about 1100° C. The handle substrate comprising the polycrystalline silicon charge trapping layer may be annealed for a duration between about 1 second and about 300 seconds, such as between about 5 seconds and about 60 seconds, or between about 10 seconds and about 40 seconds. The ambient atmosphere for anneal may comprise hydrogen, hydrogen chloride, chlorine, or any combination of hydrogen, hydrogen chloride, and chlorine. After the appropriate anneal duration, the CVD chamber may be cooled to a temperature safe for removal single crystal semiconductor handle substrate.

In some embodiments, an oxide film may be formed on top of the deposited charge trapping layer. This may be accomplished by means known in the art, such as thermal oxidation (in which some portion of the deposited semiconductor material film will be consumed) and/or CVD oxide deposition. In some embodiments, the charge trapping layer may be thermally oxidized (in which some portion of the deposited semiconductor material film will be consumed) or the silicon dioxide film may be grown by CVD oxide deposition. In some embodiments, the charge trapping layer deposited on the front surface of the single crystal semiconductor handle substrate may be thermally oxidized in a furnace such as an ASM A400. The temperature may range from 750° C. to 1200° C. in an oxidizing ambient. The oxidizing ambient atmosphere can be a mixture of inert gas, such as Ar or $N_2$, and $O_2$. The oxygen content may vary from 1 to 10 percent, or higher. In some embodiments, the oxidizing ambient atmosphere may be up to 100% (a "dry oxidation"). In an exemplary embodiment, semiconductor handle wafers may be loaded into a vertical furnace, such as an A400. The temperature is ramped to the oxidizing temperature with a mixture of $N_2$ and $O_2$. After the desired oxide thickness has been obtained, the $O_2$ is turned off and the furnace temperature is reduced and wafers are unloaded from the furnace. In order to incorporate nitrogen in the interfacial layer to deposit silicon nitride or silicon oxynitride, the atmosphere may comprise nitrogen alone or a combination of oxygen and nitrogen, and the temperature may be increased to a temperature between 1100° C. and 1400° C. An alternative nitrogen source is ammonia. In some embodiments, the charge trapping layer may be oxidized for a duration sufficient to provide an oxide layer of at least about 0.01 micrometers thick, or at least about 0.05 micrometers thick, such as between about 0.05 micrometers and about 4 micrometers, such as between about 0.1 micrometers and about 2 micrometers, or between about 0.2 micrometers and about 0.4 micrometers.

After deposition of the charge trapping layer, and optional oxidation, wafer cleaning and polishing is optional. In some embodiments, the deposited polycrystalline silicon charge trapping layer has a surface roughness as measured by $RMS_{2\times2\ um2}$ on the order of 50 nanometers. If desired, the wafers can be cleaned, for example, in a standard SC1/SC2 solution. Additionally, the wafers, particularly, the optional silicon dioxide layer on the charge trapping layer, may be subjected to chemical mechanical polishing (CMP) to reduce the surface roughness, preferably to the level of $RMS_{2\times2\ um2}$ is less than about 5 angstroms, such as between about 1 angstrom and about 2 angstroms, wherein root mean squared—

$$R_q = \sqrt{\frac{1}{n}\sum_{i=1}^{n} y_i^2},$$

the roughness profile contains ordered, equally spaced points along the trace, and $y_i$ is the vertical distance from the mean line to the data point. At a surface roughness of preferably less than 2 angstroms, the surface is ready for bonding or optional oxidation.

The single crystal semiconductor handle wafer prepared according to the method described herein to comprise a charge trapping layer, and, optionally, an oxide film, is next bonded a single crystal semiconductor donor substrate, e.g., a single crystal semiconductor donor wafer, which is prepared according to conventional layer transfer methods. That is, the single crystal semiconductor donor wafer may be subjected to standard process steps including oxidation, implant, and post implant cleaning. Accordingly, a single crystal semiconductor donor substrate, such as a single crystal semiconductor wafer of a material that is conventionally used in preparation of multilayer semiconductor structures, e.g., a single crystal silicon donor wafer, that has been etched and polished and optionally oxidized, is subjected to ion implantation to form a damage layer in the donor substrate.

In some embodiments, the front surface of the single crystal semiconductor donor substrate may be thermally oxidized (in which some portion of the semiconductor material will be consumed) or the silicon dioxide film may be grown by CVD oxide deposition. In some embodiments, the single crystal semiconductor donor substrate, e.g., a single crystal silicon donor wafer, may be thermally oxidized in a furnace such as an ASM A400. The temperature may range from 750° C. to 1200° C. in an oxidizing ambient. The oxidizing ambient atmosphere can be a mixture of inert gas, such as Ar or $N_2$, and $O_2$. The oxygen content may vary from 1 to 10 percent, or higher. In some embodiments, the oxidizing ambient atmosphere may be up to 100% (a "dry oxidation"). In an exemplary embodiment, semiconductor donor wafers may be loaded into a vertical furnace, such as an A400. The temperature is ramped to the oxidizing temperature with a mixture of $N_2$ and $O_2$. After the desired oxide thickness has been obtained, the $O_2$ is turned off and the furnace temperature is reduced and wafers are unloaded from the furnace. In some embodiments, the donor substrates are oxidized to provide an oxide layer on the front surface layer of at least about 1 nanometer thick, such as between about 0.01 micrometers and about 10 micrometers, such as between about 0.01 micrometers and about 2 micrometers, or between about 0.1 micrometers and about 1 micrometers. The oxidation process additionally oxidizes the back surface of the donor substrate, which advantageously reduces warp and bow potentially caused by the different coefficients of thermal expansion of silicon and silicon dioxide.

Ion implantation may be carried out in a commercially available instrument, such as an Applied Materials Quantum H. Implanted ions include He, H, $H_2$, or combinations thereof. Ion implantation is carried out at a density and duration sufficient to form a damage layer in the semiconductor donor substrate. Implant density may range from about $10^{12}$ ions/cm$^2$ to about $10^{17}$ ions/cm$^2$, such as from about $10^{14}$ ions/cm$^2$ to about $10^{17}$ ions/cm$^2$. Implant energies may range from about 1 keV to about 3,000 keV, such as from about 10 keV to about 3,000 keV. In some embodiments it may be desirable to subject the single crystal semiconductor donor wafers, e.g., single crystal silicon donor wafers, to a clean after the implant. In some preferred embodiments, the clean could include a Piranha clean followed by a DI water rinse and SC1/SC2 cleans.

In some embodiments of the present invention, the single crystal semiconductor donor substrate having an ion implant region therein formed by helium ion and/or hydrogen ion implant is annealed at a temperature sufficient to form a thermally activated cleave plane in the single crystal semiconductor donor substrate. An example of a suitable tool might be a simple Box furnace, such as a Blue M model. In some preferred embodiments, the ion implanted single crystal semiconductor donor substrate is annealed at a temperature of from about 200° C. to about 350° C., from about 225° C. to about 325° C., preferably about 300° C. Thermal annealing may occur for a duration of from about 2 hours to about 10 hours, such as from about 2 hours to about 8 hours. Thermal annealing within these temperatures ranges is sufficient to form a thermally activated cleave plane. After the thermal anneal to activate the cleave plane, the single crystal semiconductor donor substrate surface is preferably cleaned.

In some embodiments, the ion-implanted and optionally cleaned and optionally annealed single crystal semiconductor donor substrate is subjected to oxygen plasma and/or nitrogen plasma surface activation. In some embodiments, the oxygen plasma surface activation tool is a commercially available tool, such as those available from EV Group, such as EVG0810LT Low Temp Plasma Activation System. The ion-implanted and optionally cleaned single crystal semiconductor donor wafer is loaded into the chamber. The chamber is evacuated and backfilled with O$_2$ to a pressure less than atmospheric to thereby create the plasma. The single crystal semiconductor donor wafer is exposed to this plasma for the desired time, which may range from about 1 second to about 120 seconds. Oxygen plasma surface oxidation is performed in order to render the front surface of the single crystal semiconductor donor substrate hydrophilic and amenable to bonding to a single crystal semiconductor handle substrate prepared according to the method described above.

The hydrophilic front surface layer of the single crystal semiconductor donor substrate and the front surface of the single crystal semiconductor handle substrate, which is optionally oxidized, are next brought into intimate contact to thereby form a bonded structure. Since the mechanical bond is relatively weak, the bonded structure is further annealed to solidify the bond between the donor wafer and the handle wafer. In some embodiments of the present invention, the bonded structure is annealed at a temperature sufficient to form a thermally activated cleave plane in the single crystal semiconductor donor substrate. An example of a suitable tool might be a simple Box furnace, such as a Blue M model. In some preferred embodiments, the bonded structure is annealed at a temperature of from about 200° C. to about 350° C., from about 225° C. to about 325° C., preferably about 300° C. Thermal annealing may occur for a duration of from about 0.5 hours to about 10 hours, preferably a duration of about 2 hours. Thermal annealing within these temperatures ranges is sufficient to form a thermally activated cleave plane. After the thermal anneal to activate the cleave plane, the bonded structure may be cleaved.

After the thermal anneal, the bond between the single crystal semiconductor donor substrate and the single crystal semiconductor handle substrate is strong enough to initiate layer transfer via cleaving the bonded structure at the cleave plane. Cleaving may occur according to techniques known in the art. In some embodiments, the bonded structure may be placed in a conventional cleave station affixed to stationary suction cups on one side and affixed by additional suction cups on a hinged arm on the other side. A crack is initiated near the suction cup attachment and the movable arm pivots about the hinge cleaving the wafer apart. Cleaving removes a portion of the semiconductor donor wafer, thereby leaving a semiconductor device layer, preferably a silicon device layer, on the semiconductor-on-insulator composite structure.

After cleaving, the cleaved structure may be subjected to a high temperature anneal in order to further strengthen the bond between the transferred device layer and the single crystal semiconductor handle substrate. An example of a suitable tool might be a vertical furnace, such as an ASM A400. In some preferred embodiments, the bonded structure is annealed at a temperature of from about 1000° C. to about 1200° C., preferably at about 1000° C. Thermal annealing may occur for a duration of from about 0.5 hours to about 8 hours, preferably a duration of about 4 hours. Thermal annealing within these temperatures ranges is sufficient to strengthen the bond between the transferred device layer and the single crystal semiconductor handle substrate.

After the cleave and high temperature anneal, the bonded structure may be subjected to a cleaning process designed to remove thin thermal oxide and clean particulates from the surface. In some embodiments, the single crystal semiconductor donor wafer may be brought to the desired thickness and smoothness by subjecting to a vapor phase HCl etch process in a horizontal flow single wafer epitaxial reactor using H$_2$ as a carrier gas. In some embodiments, the thickness of the device layer may be between about 1 nanometer and about 100 micrometers, such as between about 10 nanometers and about 50 micrometers. In some embodiments, an epitaxial layer may be deposited on the transferred device layer. The finished SOI wafer comprises the semiconductor handle substrate, the charge trapping layer, the dielectric layer (e.g., buried oxide layer), and the semiconductor device layer, may then be subjected to end of line metrology inspections and cleaned a final time using typical SC1-SC2 process.

Figure 4:
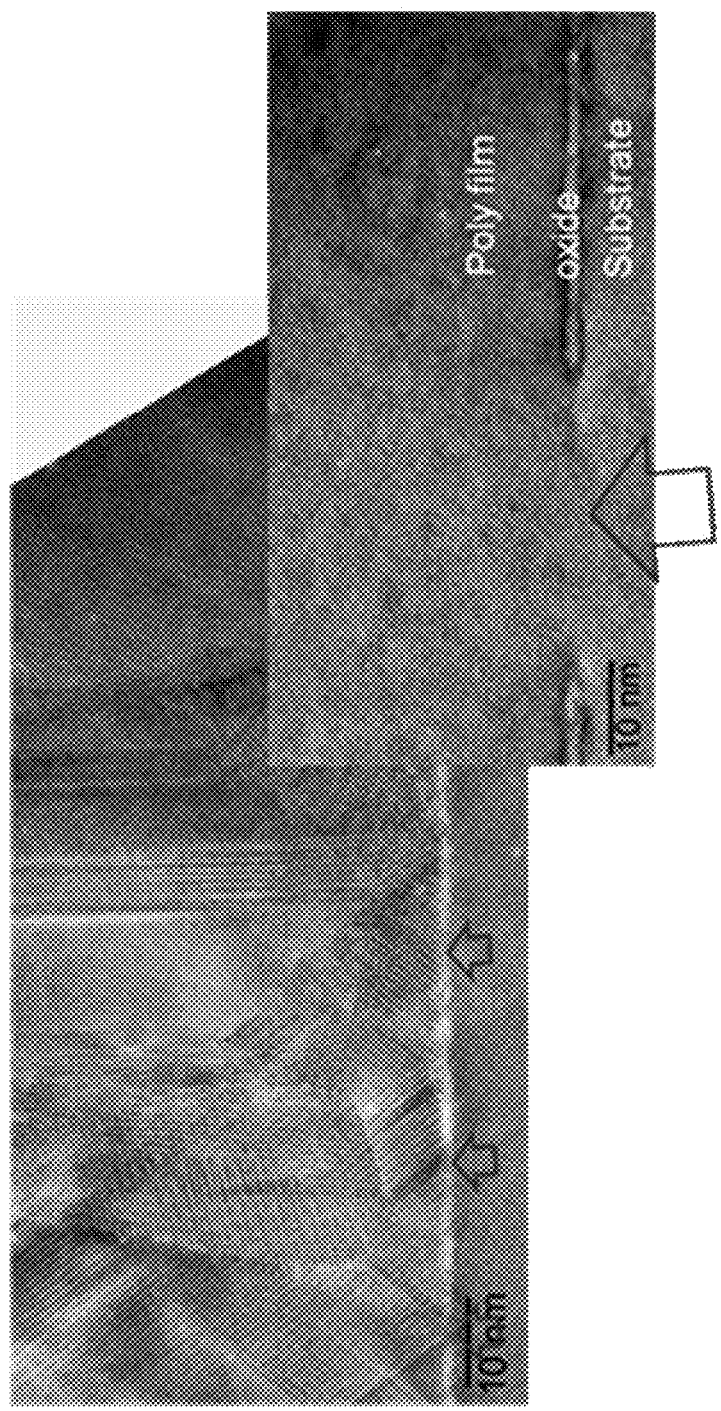
FIG. 4 is cross-sectional images of polycrystalline silicon charge trapping layers formed on monocrystalline silicon handle substrates.
Figure 5:
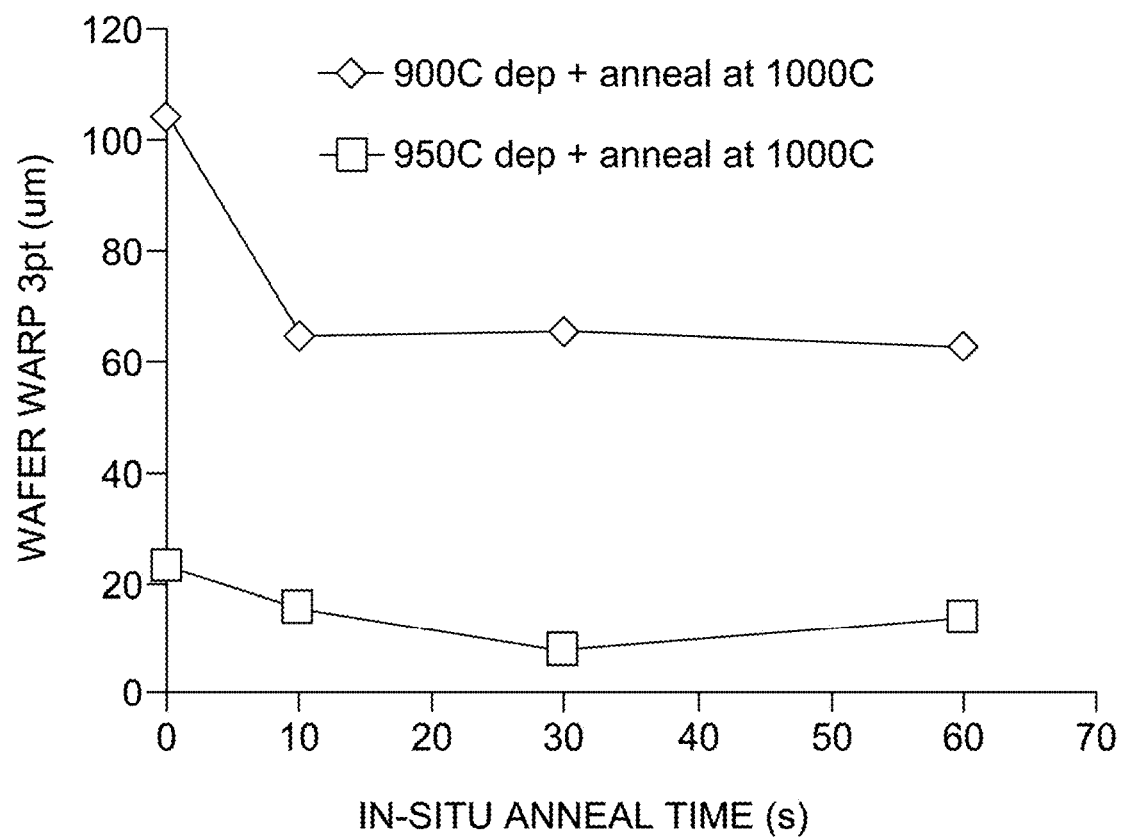
FIG. 5 is a graph depicting the dependence of wafer warp on the conditions of polycrystalline silicon deposition and annealing.

According to the present invention, SOI wafers are obtained with the deposited semiconductor material charge trapping layer embedded underneath of BOX. With reference to FIG. 3, layer transfer is performed by conventional techniques thus creating a semiconductor-on-insulator (e.g., silicon-on-insulator) structure 40 comprising at least the following layers or regions: the handle substrate 42, a semiconductor oxide layer 44, a charge trapping layer 46, a dielectric layer 48 (e.g., buried oxide) and a single crystal semiconductor device layer 50 (e.g., a silicon layer derived from a single crystal silicon donor substrate). In some embodiments, semiconductor-on-insulator (e.g., silicon-on-insulator) structure 40 is prepared comprising at least the following layers or regions: the handle substrate 42, a semiconductor nitride or oxynitride layer 44, a charge trapping layer 46, a dielectric layer 48 (e.g., buried oxide) and a single crystal semiconductor device layer 50 (e.g., a silicon layer derived from a single crystal silicon donor substrate). As shown by the images of FIG. 4 and the graph of FIG. 5, the deposition method of the present invention advantageously produces wafers comprising polycrystalline silicon charge trapping layers of reduce contamination and semiconductor-on-insulator (e.g., silicon-on-insulator) structures of reduced wafer bow. Wafer bow may be measured by the variance of at least three points on the front surface of the semiconductor device layer and/or the back surface of the single crystal semiconductor handle substrate. According to the present invention, SOI structures may comprise wafer bow of less than about 80 micrometers, less than about 60 micrometers, or less than about 20 micrometers.

Having described the invention in detail, it will be apparent that modifications and variations are possible without departing from the scope of the invention defined in the appended claims.

EXAMPLES

The following non-limiting examples are provided to further illustrate the present invention.

Example 1

In one example, a silicon wafer sliced from an ingot grown by the Czochralski method is cleaned using SC1 solution. The cleaning is sufficient to obtain a chemical silicon oxide layer having a thickness between 0.8 nm and 2.0 nm on the front surface of the silicon wafer. The wafer is next loaded into a chemical vapor deposition chamber. The wafer is heated up to a temperature from 850° C. to 1000° C. Once the temperature set point is reached, the wafer is baked at the same temperature for between 5 seconds to 60 seconds, preferably between 10 seconds to 40 seconds. The ambient atmosphere in the CVD chamber is either $H_2$ or a combination of $H_2$ and an etching gas such as HCl or $Cl_2$. The reducing atmosphere, which optionally comprises etching gas, is introduced to the chamber to removal wafer surface contamination. When the bake is complete, the wafer is subject to chemical vapor deposition of polycrystalline silicon at the same temperature as the reducing atmosphere bake. The silicon precursors for chemical vapor deposition of polycrystalline silicon include trichlorosilane, dichlorosilane, silane, and their derivatives. The chemical vapor deposition of polycrystalline silicon occurs under either atmospheric pressure or reduced pressure. The deposition rate ranges from 0.1 um/min to 2 um/min. After the desired thickness of the polycrystalline layer is achieved, which may be between 0.5 micrometer and 3 micrometers, the wafer is cooled down to a safe temperature for unloading, which is between 700° C. to 900° C.

Example 2

In one example, a silicon wafer sliced from an ingot grown by the Czochralski method is cleaned using SC1 solution. The cleaning is sufficient to obtain a chemical silicon oxide layer having a thickness between 0.8 nm and 2.0 nm on the front surface of the silicon wafer. The wafer is next loaded into a chemical vapor deposition chamber. The wafer is heated up to a temperature from 850° C. to 1000° C. Once the temperature set point is reached, the wafer is baked at the same temperature for between 5 seconds to 60 seconds, preferably between 10 seconds to 40 seconds. The ambient atmosphere in the CVD chamber is either $H_2$ or a combination of $H_2$ and an etching gas such as HCl or $Cl_2$. The reducing atmosphere, which optionally comprises etching gas, is introduced to the chamber to removal wafer surface contamination. When the bake is complete, the wafer is subject to chemical vapor deposition of polycrystalline silicon at the same temperature as the reducing atmosphere bake. The silicon precursors for chemical vapor deposition of polycrystalline silicon include trichlorosilane, dichlorosilane, silane, and their derivatives. The chemical vapor deposition of polycrystalline silicon occurs under either atmospheric pressure or reduced pressure. The deposition rate ranges from 0.1 um/min to 2 um/min. After the polycrystalline silicon is deposited to the desired thickness, the wafer temperature is ramped up to a higher temperature than the deposition temperature to anneal out the residue film stress. The temperature for effective film stress release is 1000° C. or above, such as 1050° C. or 1100° C. The anneal soak time is 10 seconds or longer. When annealing is complete, the wafer is cooled down to a safe temperature for unloading. See FIG. 5, which is a graph depicting the dependence of wafer warp on the conditions of polycrystalline silicon deposition and annealing. The residual film stress in the polysilicon film can be controlled from 0 to 100 MPa by varying the conditions of oxide bake, deposition temperature and rate, and annealing after the deposition to meet the wafer bow and warp specifications (typically <60 um for both 200 mm and 300 mm wafers). For a given film stress, wafer bow and warp increases in proportion to the film thickness. Therefore, the disclosed polysilicon process enables the growth of thick polysilicon films up to tens of micrometers. After the desired thickness of the polycrystalline layer is achieved, which may be between 0.5 micrometer and 3 micrometers, and after the anneal, the wafer is cooled down to a safe temperature for unloading, which is between 700° C. to 900° C.

Example 3

In one example, a silicon wafer sliced from an ingot grown by the Czochralski method is cleaned using SC1 solution. The cleaning is sufficient to obtain a chemical silicon oxide layer having a thickness between 0.8 nm and 2.0 nm on the front surface of the silicon wafer. The wafer is next loaded into a chemical vapor deposition chamber. The wafer is heated up to a temperature from 850° C. to 1000° C. Once the temperature set point is reached, the wafer is baked at the same temperature for between 5 seconds to 60 seconds, preferably between 10 seconds to 40 seconds. The ambient atmosphere in the CVD chamber is either $H_2$ or a combination of $H_2$ and an etching gas such as HCl or $Cl_2$. The reducing atmosphere, which optionally comprises etching gas, is introduced to the chamber to removal wafer surface contamination. When the bake is complete, the wafer is subject to chemical vapor deposition of polycrystalline silicon seed at the same temperature as the reducing atmosphere bake. The thickness of the seed layer ranges from 10 nm to 200 nm. After the seed layer is deposited to the desired thickness, the temperature is ramped to a higher temperature to anneal out the residue film stress. The thickness of the seed layer is set by the size of the polycrystalline silicon nuclei. To achieve effective stress release, the seed layer needs to cover the substrate surface while leaving voids smaller than 50 nm, which enables the access of $H_2$ to the interface between the polysilicon seed layer and oxide. $H_2$ reduces the interfacial oxide and promote the diffusion of the atoms at the grain boundaries of the polysilicon seed layer to the substrate and thus releases the film stress. When the seed layer is thick enough to completely prevent $H_2$ access to the interfacial oxide, the subsequent annealing process is not able to release the film stress effectively. On the other hand, when the seed layer is not continuous and the opening area between two adjacent nuclei is wider than 50 nm, large nuclei are formed after the oxide layer is removed during the seed annealing process. The large nuclei will grow into big grains (>1 um) at the end of polysilicon deposition, which reduces the trapping efficiency. Compared to example 2, this example provides additional in-situ control mechanism to engineer the film stress. The temperature for effective film stress release is 1000° C. or above, such as 1050° C. or 1100° C. The anneal soak time is 10 seconds or longer, such as 30 seconds. Then the temperature is ramped down to a lower temperature from 850° C. to 1000° C. At this reduced temperature, the remainder of the polycrystalline silicon layer is deposited. After the desired polycrystalline silicon thickness is deposited, the wafer is cooled down to a safe temperature for unloading. After the desired thickness of the polycrystalline layer is achieved, which may be between 0.5 micrometer and 3 micrometers, the wafer is cooled down to a safe temperature for unloading, which is between 700° C. to 900° C.

As various changes could be made in the above compositions and processes without departing from the scope of the invention, it is intended that all matter contained in the above description be interpreted as illustrative and not in a limiting sense.

When introducing elements of the present invention or the preferred embodiment(s) thereof, the articles "a," "an," "the," and "said" are intended to mean that there are one or more of the elements. The terms "comprising," "including," and "having" are intended to be inclusive and mean that there may be additional elements other than the listed elements.

What is claimed is:

1. A multilayer structure comprising:
   a single crystal semiconductor handle substrate comprising two major, generally parallel surfaces, one of which is a front surface of the single crystal semiconductor handle substrate and the other of which is a back surface of the single crystal semiconductor handle substrate, a circumferential edge joining the front and back surfaces of the single crystal semiconductor handle substrate, a central plane between the front surface and the back surface of the single crystal semiconductor handle substrate, and a bulk region between the front and back surfaces of the single crystal semiconductor handle substrate, wherein the single crystal semiconductor handle substrate has a minimum bulk region resistivity of at least about 500 ohm-cm;
   a textured semiconductor oxide layer, a textured semiconductor nitride layer, or a textured semiconductor oxynitride layer in interfacial contact with the front surface of the single crystal semiconductor handle substrate, wherein the textured semiconductor oxide layer comprises holes having sizes between about 5 nanometers and about 1000 nanometers, the textured semiconductor nitride layer comprises holes having sizes between about 5 nanometers and about 1000 nanometers, or the textured semiconductor oxynitride layer comprises holes having sizes between about 5 nanometers and about 1000 nanometers;
   a polycrystalline silicon layer in interfacial contact with the textured semiconductor oxide layer, the textured semiconductor nitride layer, or the textured semiconductor oxynitride layer;
   a dielectric layer in interfacial contact with the polycrystalline silicon layer; and
   a single crystal semiconductor device layer in interfacial contact with the dielectric layer,
   wherein the multilayer structure has wafer bow as measured by at least three points on a front surface of the semiconductor device layer and/or the back surface of the single crystal semiconductor handle substrate of less than about 80 micrometers.

2. The multilayer structure of claim 1 wherein the single crystal semiconductor handle substrate comprises a single crystal silicon wafer, and the textured semiconductor oxide layer comprises textured silicon dioxide.

3. The multilayer structure of claim 1 wherein the single crystal semiconductor handle substrate comprises a single crystal silicon wafer, and the textured semiconductor nitride layer comprises textured silicon nitride.

4. The multilayer structure of claim 1 wherein the single crystal semiconductor handle substrate comprises a single crystal silicon wafer, and the textured semiconductor oxynitride layer comprises textured silicon oxynitride.

5. The multilayer structure of claim 1 wherein the holes have sizes between about 5 nanometers and about 500 nanometers.

6. The multilayer structure of claim 1 wherein the holes have sizes between about 5 nanometers and about 200 nanometers.

7. The multilayer structure of claim 1 wherein the textured semiconductor oxide layer, the textured semiconductor nitride layer, or the textured semiconductor oxynitride layer has a thickness between about 0.1 nanometers and about 25 nanometers.

8. The multilayer structure of claim 1 wherein the single crystal semiconductor handle substrate has a bulk resistivity between about 500 Ohm-cm and about 100,000 Ohm-cm.

9. The multilayer structure of claim 1 wherein the single crystal semiconductor handle substrate has a bulk resistivity between about 1000 ohm cm and about 10,000 Ohm-cm.

10. The multilayer structure of claim 1 wherein the single crystal semiconductor handle substrate has a bulk resistivity between about 3000 Ohm cm and about 5,000 Ohm-cm.

11. The multilayer structure of claim 1 wherein the polycrystalline silicon layer has a thickness between about 0.1 micrometer and about 10 micrometers.

12. The multilayer structure of claim 1 wherein the polycrystalline silicon layer has a thickness between about 0.5 micrometer and about 5 micrometers.

13. The multilayer structure of claim 1 wherein the polycrystalline silicon layer has a resistivity of at least about 1000 Ohm-cm.

14. The multilayer structure of claim 1 wherein the polycrystalline silicon layer has a resistivity of at least about 3000 Ohm-cm.

15. The multilayer structure of claim 1 wherein the wafer bow as measured by at least three points on the front surface of the semiconductor device layer and/or the back surface of the single crystal semiconductor handle substrate of less than about 60 micrometers.

16. The multilayer structure of claim 1 wherein the wafer bow as measured by at least three points on the front surface of the semiconductor device layer and/or the back surface of the single crystal semiconductor handle substrate of less than about 20 micrometers.

* * * * *